United States Patent
Balan et al.

(10) Patent No.: US 10,468,288 B2
(45) Date of Patent: Nov. 5, 2019

(54) METHODS AND SYSTEMS FOR CHUCKING A WARPED WAFER

(71) Applicant: KLA-Tencor Corporation, Milpitas, CA (US)

(72) Inventors: Aviv Balan, Mountain View, CA (US); Luping Huang, Dublin, CA (US); Savita Chandan, San Jose, CA (US); Chia-Chu Chen, San Jose, CA (US); Teck Meriam, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 282 days.

(21) Appl. No.: 15/383,207

(22) Filed: Dec. 19, 2016

(65) Prior Publication Data
US 2018/0108559 A1     Apr. 19, 2018

Related U.S. Application Data

(60) Provisional application No. 62/409,880, filed on Oct. 19, 2016.

(51) Int. Cl.
*H01L 21/683* (2006.01)
*H01L 21/687* (2006.01)
*H01L 21/67* (2006.01)

(52) U.S. Cl.
CPC .... *H01L 21/6838* (2013.01); *H01L 21/67126* (2013.01); *H01L 21/68735* (2013.01); *H01L 21/68742* (2013.01); *H01L 21/68764* (2013.01)

(58) Field of Classification Search
CPC ........ B25B 11/00; B25B 11/02; B25B 11/005
See application file for complete search history.

(56) References Cited

U.S. PATENT DOCUMENTS

| | | | |
|---|---|---|---|
| 5,177,857 A * | 1/1993 | Ito | B25B 11/005 269/21 |
| 6,196,532 B1 * | 3/2001 | Otwell | B25B 11/005 269/21 |

(Continued)

FOREIGN PATENT DOCUMENTS

WO     2016-018831 A2     2/2016

OTHER PUBLICATIONS

International Search Report dated Jan. 24, 2018, for PCT Application No. PCT/US2017/057244 filed on Oct. 18, 2017 by KLA-Tencor Corporation, 3 pages.

*Primary Examiner* — Lee D Wilson
(74) *Attorney, Agent, or Firm* — Spano Law Group; Joseph S. Spano

(57) ABSTRACT

Methods and systems for vacuum mounting a warped, thin substrate onto a flat chuck are presented herein. A vacuum chuck includes three or more collapsible bellows that move above the chuck and into contact with a warped substrate. The bellows seal and vacuum clamp onto the backside surface of the substrate. In some embodiments, the bellows collapse by at least five hundred micrometers while clamping. An extensible sealing element is mounted in a recessed annular channel on the surface of the chuck body. As the substrate moves toward the chucking surface, the extensible sealing element extends at least five millimeters above the chuck body and into contact with the substrate. As the space between the chuck and the substrate is evacuated, the extensible sealing element collapse into the recessed annular channel, and the substrate is clamped onto the flat chucking surface of chuck body.

15 Claims, 5 Drawing Sheets

(56) References Cited

U.S. PATENT DOCUMENTS

| | | | | |
|---|---|---|---|---|
| 6,302,387 | B1* | 10/2001 | Schmalz | B25B 11/005 |
| | | | | 269/20 |
| 6,502,808 | B1* | 1/2003 | Stone | B23B 31/307 |
| | | | | 269/21 |
| 7,192,017 | B2* | 3/2007 | Wang | B25B 11/005 |
| | | | | 269/21 |
| 7,292,427 | B1 | 11/2007 | Murdoch et al. | |
| 2004/0207838 | A1 | 10/2004 | Ebert et al. | |
| 2009/0057971 | A1* | 3/2009 | Bumgarner | B23Q 1/035 |
| | | | | 269/21 |
| 2011/0024047 | A1 | 2/2011 | Nguyen | |
| 2013/0255407 | A1 | 10/2013 | Chilese et al. | |
| 2016/0163580 | A1 | 6/2016 | Huang et al. | |
| 2018/0108559 | A1* | 4/2018 | Balan | H01L 21/6838 |

* cited by examiner

METHODS AND SYSTEMS FOR CHUCKING A WARPED WAFER

CROSS REFERENCE TO RELATED APPLICATION

The present application for patent claims priority under 35 U.S.C. § 119 from U.S. provisional patent application Ser. No. 62/409,880, filed Oct. 19, 2016, the subject matter of which is incorporated herein by reference in its entirety.

TECHNICAL FIELD

The described embodiments relate to systems for specimen handling, and more particularly to clamping a warped wafer to a flat wafer chuck.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography, among others, is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

A lithographic process, as described above, is performed to selectively remove portions of a resist material overlaying the surface of a wafer, thereby exposing underlying areas of the specimen on which the resist is formed for selective processing such as etching, material deposition, implantation, and the like. Therefore, in many instances, the performance of the lithography process largely determines the characteristics (e.g., dimensions) of the structures formed on the specimen. Consequently, the trend in lithography is to design systems and components (e.g., resist materials) that are capable of forming patterns having ever smaller dimensions. In particular, the resolution capability of the lithography tools is one primary driver of lithography research and development.

Inspection processes based on optical metrology are used at various steps during a semiconductor manufacturing process to detect defects on wafers to promote higher yield. Optical metrology techniques offer the potential for high throughput without the risk of sample destruction. A number of optical metrology based techniques including scatterometry implementations and associated analysis algorithms to characterize device geometry have been described.

A wafer is positioned within a wafer processing tool (e.g., lithography tool, etch tool, inspection tool, metrology tool, etc.) by clamping the thin wafer to a flat wafer chuck. The wafer chuck is a machine part that provides the interface between the wafer and the rest of the machine. The wafer is precisely positioned within the tool by precisely controlling the movements of the wafer chuck to which the wafer is attached. The dimensions of the surface of the wafer chuck that interfaces with the wafer are precisely manufactured and maintained during the operation of the tool.

Wafers themselves are very thin (e.g., 200 micrometers to 1.5 millimeters thick) and have relatively large diameters (e.g., 200-300 millimeters, or more). For this reason, the shape of a wafer is not particularly stable in its unconstrained (i.e., unsupported) state. This is particularly true for wafer flatness. During processing, the wafer is clamped to the wafer chuck over a large portion of its backside surface area. By forcing the wafer to conform to the shape of the wafer chuck, the wafer chuck flattens the wafer, so that wafer processing and inspection tasks can be completed successfully.

In many examples, wafers are clamped to the wafer chuck by vacuum. As the wafer is lowered onto the wafer chuck, the backside wafer surface comes into contact with the chuck and covers vacuum channels machined into the surface of the wafer chuck. As the wafer covers the vacuum channels, the vacuum supplied at the channels effectively pulls the wafer down onto the surface of wafer chuck and maintains the wafer in the clamped position as long as vacuum is maintained at the channels.

Unfortunately, this approach to clamping the wafer to the surface of the wafer chuck is problematic when the wafer is extremely warped (i.e., not flat). In some examples, 300 millimeter diameter wafers exhibit variation in flatness from hundreds of micrometers (e.g., 500 micrometers) to several millimeters (e.g., 8-10 millimeters). When a wafer is extremely warped (e.g., flatness variation exceeding one millimeter), the wafer does not uniformly cover the vacuum channels of the wafer chuck. This results in large vacuum leaks that reduce the clamping force exerted by each vacuum channel. In many scenarios, the reduced clamping force is unable to achieve adequate force levels required to pull the wafer from its deformed state down onto the wafer chuck. As a result, the wafer chuck is unable to adequately constrain the wafer and further processing of the wafer is not possible without additional intervention. In some scenarios, increased vacuum flow is able to compensate for the large leaks and generate enough force to successfully clamp the wafer. But, realizing high vacuum flows is often undesirable from both design and operational perspectives (e.g., increased design complexity and cost). In some scenarios, increased vacuum flow is not enough to overcome large leaks generated by warped wafers. In these scenarios, the wafer may have to be discarded or specially processed to reduce warpage.

Improved methods and systems for chucking warped wafers in semiconductor processing equipment are desired.

SUMMARY

Methods and systems for vacuum mounting a warped, thin substrate, such as a semiconductor wafer, onto a flat chuck are presented herein. In one aspect, a vacuum chuck includes three or more collapsible bellows mounted to lift structures. The lift structures are configured to move the bellows above the chucking surface and into contact with a warped substrate. The bellows seal onto the backside surface of the substrate and a vacuum is generated inside the bellows. In some embodiments, the bellows collapse by at least five hundred micrometers and clamp themselves to the substrate. Subsequently, the lift structures move the collapsible bellows toward the chucking surface with the attached substrate.

In a further aspect, the chuck is also moveable with respect to a motion stage subsystem in the direction orthogonal to the flat chucking surface of the chuck body. In this manner, the movement of the extensible bellows with respect to chuck body is determined by both the movement of extensible bellows and the movement of chuck body.

In another aspect, an extensible sealing element is mounted to the bottom surface of a recessed annular channel fabricated into the surface of the chuck body. Each extensible sealing element is configured to extend at least five millimeters above the flat chucking surface of the chuck body. The extensible sealing element extends along the path of the recessed annular channel and is shaped to collapse into the recessed annular channel when a substrate is fully clamped onto the flat chucking surface of chuck body.

In a further aspect, a recessed annular channel that accommodates an extensible sealing element is coupled to a vacuum bleed orifice to regulate an amount of vacuum maintained in the recessed annular channel. The vacuum bleed orifice reduces the vacuum maintained in the recessed annular channel, particularly when the substrate is vacuum clamped to the chuck body. In some embodiments, a valve is connected in line with the vacuum bleed orifice to further control the amount of vacuum maintained in the recessed annular channel. In some further embodiments, the valve is controllable by a computing system interfaced with the vacuum chuck.

In another further aspect, one or more vacuum channels are distributed across the chucking surface of the chuck body. Each of the one or more vacuum channels are coupled to a vacuum source such that a vacuum is drawn through the one or more vacuum channels to vacuum clamp the substrate to the chucking surface of the chuck body.

The foregoing is a summary and thus contains, by necessity, simplifications, generalizations and omissions of detail. Consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for vacuum mounting a warped, thin substrate, such as a semiconductor wafer, onto a flat chuck are presented herein.

In one aspect, a vacuum chuck includes three or more collapsible bellows mounted to lift structures configured to move the bellows above the chucking surface. The collapsible bellows are moved above the chucking surface and into contact with a warped substrate where the bellows seal onto the backside surface of the substrate. As vacuum is generated inside the bellows, the bellows themselves collapse by at least five hundred micrometers. Subsequently, the lift structures are configured to move the collapsible bellows toward the chucking surface with the substrate attached.

Figure 1:
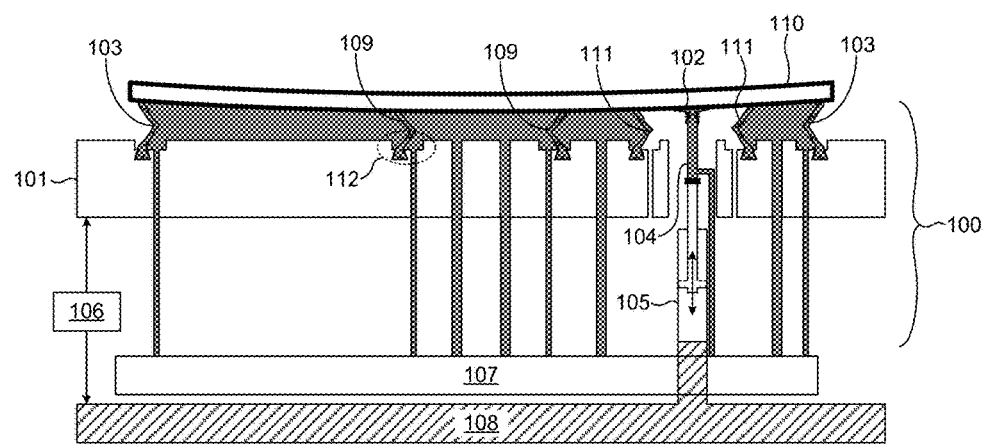
FIG. 1 is a simplified schematic view of one embodiment of a vacuum chuck 100 that may be used to perform substrate chucking methods described herein.

FIG. 1 is a simplified schematic view of one embodiment of a vacuum chuck 100 that may be used to perform substrate chucking methods described herein. FIG. 1 depicts a cutaway view of vacuum chuck 100. As depicted in FIG. 1, vacuum chuck 100 includes a chuck body 101, collapsible bellows 102, extensible sealing elements 103, 109, and 111, lift structure 104, and actuator 105.

Chuck body 101 includes a substantially flat chucking surface to which substrate 110 is vacuum chucked during operation. In some embodiments, the chucking surface of chuck body 101 is fabricated to a stringent flatness tolerance (e.g., less than two micrometers flatness across the chucking surface). In some other embodiments, the substantially flat surface of chuck body 101 includes an array of raised pads, fabricated to a stringent flatness tolerance (e.g., less than two micrometers flatness across the chucking surface). Raised pads may be employed to allow space for backside particles to rest without interfering with the interface between the flat chucking surface and the backside of the substrate. In addition, the spaces between the raised pads may be held under vacuum to vacuum clamp the substrate to the tops of the raised pads. In this manner the spaces between the raised pads form horizontal vacuum channels in the flat chucking surface of the chuck body.

Figure 3:
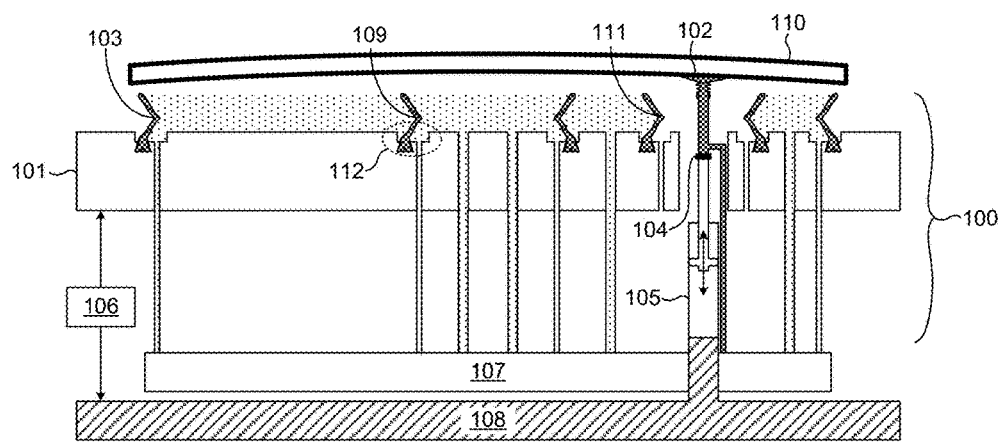
FIG. 3 is a diagram illustrative of vacuum chuck 100 in a state where the extensible bellows are fully extended away from chuck body 101; supporting warped substrate 110.

The chuck body 101 includes openings for three or more collapsible bellows 102. Each collapsible bellow is collapsable by at least five hundred micrometers in the direction orthogonal to the flat chucking surface of the chuck body (i.e., in the vertical direction as depicted in FIG. 1). Each collapsible bellows has a compliant shape that conforms to the backside surface of a warped substrate (i.e., non-planar shaped substrate). In some examples, the warped substrate is cup shaped as viewed from the perspective illustrated in FIG. 1. In some other examples, the warped substrate is domed shaped as viewed from the same perspective. By way of example, a domed shaped substrate is illustrated in FIG. 3.

A lift structure 104 is coupled to each collapsible bellows 102. The lift structure is configured to move the collapsible bellows in the direction orthogonal to the flat chucking surface. In some embodiments, the lift structure is a rod shaped structure coupled to an actuator, such as linear actuator 105. In these embodiments, a separate lift structure is coupled between each collapsible bellows and an actuator. In some other embodiments, the lift structure includes multiple rod shaped structures, each coupled to a different collapsible bellows, and a frame that couples each of the rod shaped structures together. In these embodiments, a single actuator moves the lift structure and all of the attached collapsible bellows together. In this manner, a single actuator may be employed to move all of the collapsible bellows together by movement of the lift structure. In some embodiments, elements of lift structure 104 coupled to the collapsible bellows are hollow, allowing vacuum to be transmitted from a vacuum source 107 to the collapsible bellows 102 through elements of lift structure 104.

As depicted in FIG. 1, the actuator is a pneumatic cylinder 105 configured to lift and lower the rod shaped lift structure 104 and the attached collapsible bellows 102. However, in general, any suitable actuator may be employed to move the attached collapsible bellows. For example, any of a piezoelectric actuator, Lorentz coil actuator, solenoid actuator, vacuum driven actuator, a rotary driven eccentric actuator, etc., may be contemplated within the scope of this patent document.

As depicted in FIG. 1, actuator 105 moves lift structure 104 and collapsible bellows 102 with respect to a motion stage subsystem 108. In a further aspect, the chuck body 101 is also moveable with respect to the motion stage subsystem 108 in the direction orthogonal to the flat chucking surface of the chuck body 101. As depicted in FIG. 1, actuator 106 is configured to move chuck body 101 with respect to motion stage subsystem 108. In this manner, the movement of the extensible bellows 102 with respect to chuck body 101 is determined by both the movement of extensible bellows 102 and the movement of chuck body 101. For example, to increase the distance between extensible bellows 102 and the flat chucking surface of chuck body 101, actuator 105 is extended to move extensible bellows 102 upward, while actuator 106 moves chuck body 101 downward. In this manner, the combination of movements of actuators 105 and 106 moves the extensible bellows 102 above the flat chucking surface of chuck body 101. In some embodiments, the combination of movements causes the extensible bellows 102 to reach at least ten millimeters above the flat chucking surface of chuck body 101. In this manner, extremely warped wafers may be effectively captured by extensible bellows 102. Similarly, to decrease the distance between extensible bellows 102 and the flat chucking surface of chuck body 101, actuator 105 is retracted to move extensible bellows 102 downward, while actuator 106 moves chuck body 101 upward. In this manner, the combination of movements of actuators 105 and 106 moves the extensible bellows 102 toward the flat chucking surface of chuck body 101.

Figure 2:
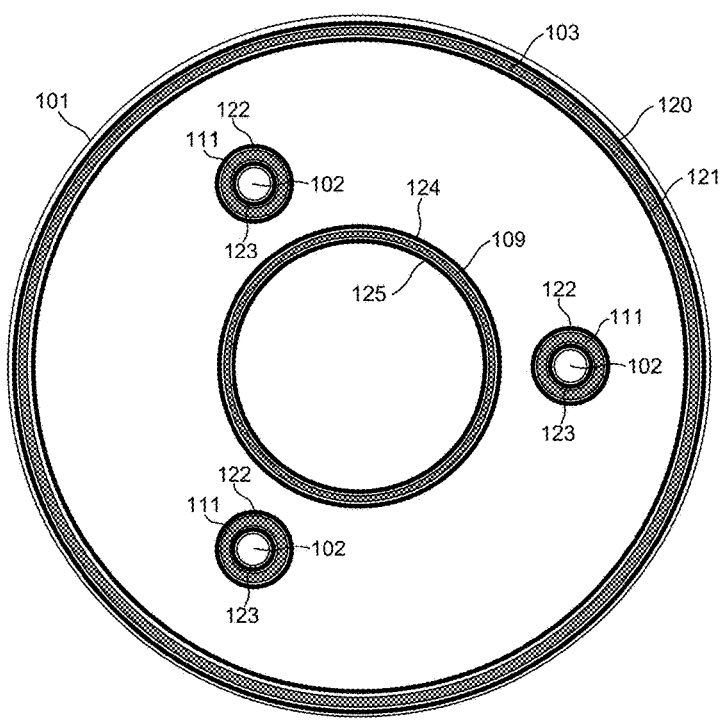
FIG. 2 is a diagram illustrative of a top view of vacuum chuck 100 illustrated in FIG. 1.

FIG. 2 depicts a top view of vacuum chuck 100 illustrated in FIG. 1. As depicted in FIG. 2, chuck body 101 includes cutaways for three extensible bellows 102 to provide stable support to the substrate 110 when the substrate is captured by the extensible bellows 102. Although three extensible bellows 102 are depicted, in general, more than three extensible bellows may be employed to support the substrate 110. Also, as depicted in FIG. 2, the extensible bellows 102 are located between two recessed annular channels 103 and 109. However, in general, in some other embodiments, the extensible bellows 102 may be located inside two or more recessed annular channels (i.e., extensible bellows are arranged at a radius that is less than the radius of two or more recessed annular channels). Although, the extensible bellows 102 are arranged at a fixed radius from the center of the chucking surface of chuck body 101, in general, the extensible bellows 102 may be located in any convenient arrangement to provide stable support of substrate 110.

In another aspect, an extensible sealing element is mounted to the bottom surface of a recessed annular channel fabricated into the surface of the chuck body. Each extensible sealing element is configured to extend at least five millimeters above the flat chucking surface of the chuck body. The extensible sealing element extends along the path of the recessed annular channel and is shaped to collapse into the recessed annular channel when substrate 110 is fully clamped onto the flat chucking surface of chuck body 101. In some examples, the extensible sealing element is made from an elastomeric material having suitable compliance and sealing properties.

FIG. 1 illustrates a cutaway view of extensible sealing elements 103, 109, and 111, while FIG. 2 illustrates a top view of extensible sealing elements 103, 109, and 111. FIG. 1 depicts a recessed annular channel 112 fabricated in chuck body 101. Each extensible sealing element is mounted within a recessed annular channel such as recessed annular channel 112. As depicted in FIG. 1, a dovetail feature is fabricated into the bottom surface of the recessed annular channel. A matching profile of the extensible sealing element fits within the dovetail feature and effectively mounts the extensible sealing element to the bottom of the recessed annular channel. Although, a dovetail feature is depicted in FIG. 1, in general, any suitable feature configured to retain the extensible sealing element within the recessed annular channel may be contemplated within this patent document.

FIG. 3 depicts vacuum chuck 100 in a state where the extensible bellows are fully extended away from chuck body 101; supporting warped substrate 110. In this configuration the extensible bellows conform and form a seal to the non-planar shaped (i.e., domed shape) backside surface of substrate 110. Vacuum is maintained within the extensible bellows 102 which effectively vacuum clamps substrate 110 to the extensible bellows 102. In this configuration, the extensible sealing elements 103, 109, and 111 are also fully extended, but they have not contacted the backside surface of substrate 110. In general, the extensible sealing elements must extend a distance that exceeds the wafer bow plus clearance required to allow the wafer loader/unloader robot (not shown) to load/unload the wafer onto the chuck. In some embodiments, the extensible sealing elements extend five millimeters, or more, above the chucking surface of chuck body 101. In some embodiments, the extensible sealing elements extend 10 millimeters, or more, above the chucking surface of chuck body 101. Although vacuum generated by vacuum source 107 causes a flow from the space between the substrate 110 and the chuck body 101 toward vacuum source 107, gaps between the extensible sealing elements and substrate 110 cause leakage that prevents vacuum clamping of substrate 110.

FIG. 1 depicts vacuum chuck 100 in a state where the extensible bellows 102 lower the substrate 110 into contact with any of extensible sealing elements 103, 109, and 111. In some embodiments, extensible sealing elements 103, 109, and 111 conform and form a seal to the shape of the backside of substrate 110 before substrate 110 is in contact with chuck body 101. With a seal formed between the extensible sealing elements and substrate 110, the vacuum supplied by vacuum source 107 begins to evacuate the spaces between substrate 110 and chuck body 101. This generates a pulling force that draws substrate 110 down onto chuck body 101. At this point, the forces generated by the vacuum generated in the spaces between substrate 110 and chuck body 101 begins to dominate the pulling forces generated by the extensible bellows. Thus, the vacuum maintained within the extensible bellows 102 is released and the lift structures 104 are dropped by actuators 105 to move extensible bellows 102 out of the way as the vacuum generated in the spaces between substrate 110 and chuck body 101 begins to build and draws the substrate 110 onto chuck body 101.

In other embodiments, substrate 110 is in contact with chuck body 110 before any of extensible sealing elements 103, 109, and 111 seals with substrate 110. In these embodiments, collapsible bellows 102 exert significant pulling force on substrate 110 to draw substrate 110 down onto chuck body 101 until extensible sealing elements 103, 109, and 111 conform and form a seal to the shape of the backside of substrate 110. In some embodiments, each collapsible bellows generates 10 Newtons or more of downward force, drawing substrate 110 onto chuck body 101. When a seal is formed between any of the extensible sealing elements and substrate 110, the vacuum supplied by vacuum source 107 begins to evacuate the spaces between substrate 110 and chuck body 101. This generates an additional pulling force that draws substrate 110 down onto chuck body 101. At this point, the forces generated by the vacuum generated in the spaces between substrate 110 and chuck body 101 begins to dominate the pulling forces generated by the extensible bellows. Thus, the vacuum maintained within the extensible bellows 102 is released and the lift structures 104 are dropped by actuators 105 to move extensible bellows 102 out of the way as the vacuum generated in the spaces between substrate 110 and chuck body 101 begins to build and draws the substrate 110 onto chuck body 101.

Figure 4:
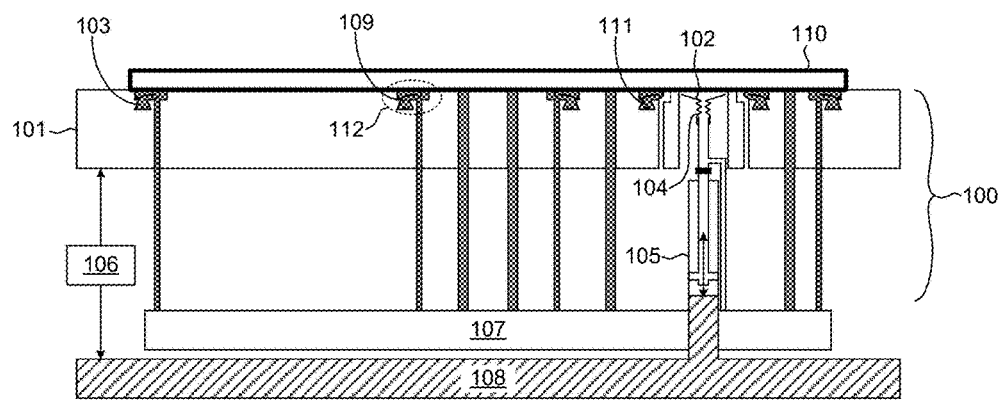
FIG. 4 is a diagram illustrative of vacuum chuck 100 in a state where the substrate 110 is vacuum clamped down onto the flat chucking surface of chuck body 101.

FIG. 4 depicts vacuum chuck 100 in a state where the substrate 110 is vacuum clamped down onto the flat chucking surface of chuck body 101. Note that as the substrate 110 is drawn down toward chuck body 101, the extensible sealing elements collapse into the recessed annular channels into which they are mounted. Furthermore, the warped substrate conforms to the flat chucking surface of chuck body 101. In this configuration, substrate 110 is vacuum clamped to chuck body 101 in a flat configuration that is suitable for further processing of the substrate.

In a further aspect, a recessed annular channel that accommodates an extensible sealing element is coupled to a vacuum bleed orifice to regulate an amount of vacuum maintained in the recessed annular channel. The vacuum bleed orifice reduces the vacuum maintained in the recessed annular channel, particularly when the substrate is vacuum clamped to the chuck body. In some embodiments, a valve is connected in line with the vacuum bleed orifice to further control the amount of vacuum maintained in the recessed annular channel. In some further embodiments, the valve is controllable by a computing system interfaced with vacuum chuck 100.

Figure 5:
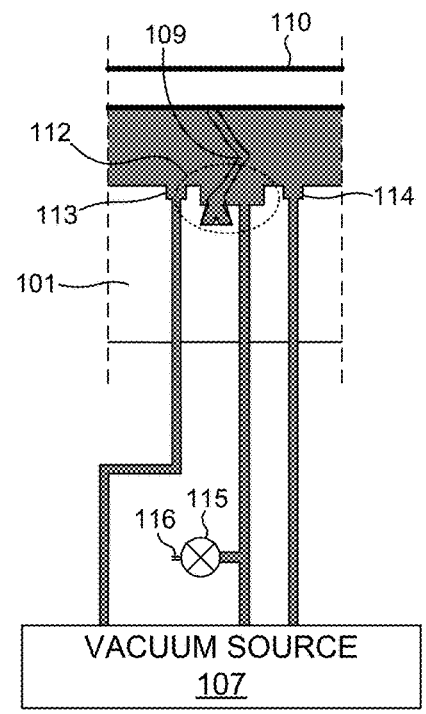
FIG. 5 is a diagram illustrative of recessed annular channel 112 when substrate 110 is not vacuum clamped to chuck body 101.
Figure 6:
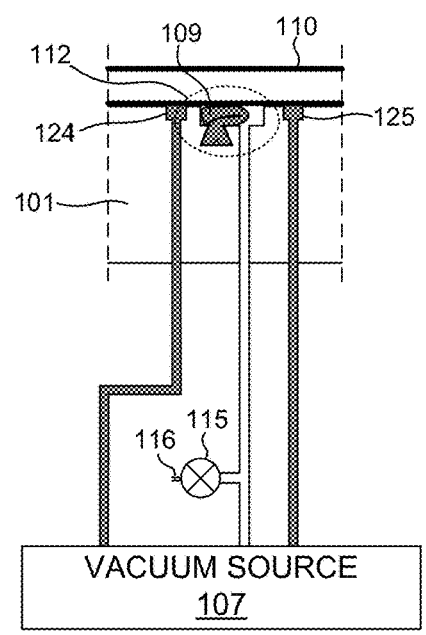
FIG. 6 is a diagram illustrative of recessed annular channel 112 when substrate 110 is vacuum clamped to chuck body 101.

FIG. 5 depicts recessed annular channel 112 when substrate 110 is not vacuum clamped to chuck body 101. FIG. 6 depicts recessed annular channel 112 when substrate 110 is vacuum clamped to chuck body 101.

In the embodiment depicted in FIG. 5, vacuum is maintained between recessed annular channel 112 by vacuum source 107 while substrate 110 is being clamped down toward chuck body 101. In this embodiment valve 115 is closed to prevent vacuum losses through orifice 116. However, when substrate 110 is vacuum clamped to chuck body 101, valve 115 is opened allowing the vacuum in recessed annular channel 112 to be reduced or completely bled off. The vacuum is reduced to minimize deflection of the portion of substrate 110 that spans the opening of recessed annular channel 112. The distance across the opening of the recessed annular channel 112 must be relatively large to accommodate the extensible sealing elements. In one embodiment, the opening is approximately 9 millimeters. If vacuum is maintained across this opening, it is possible that thin substrates may deflect downward, across the opening. By reducing the vacuum level within the recessed annular channels, these deflections are avoided.

In another further aspect, one or more vacuum channels (i.e., recessed channels) are distributed across the chucking surface of the chuck body. Each of the one or more vacuum channels are coupled to a vacuum source such that a vacuum is drawn through the one or more vacuum channels to vacuum clamp the substrate to the chucking surface of the chuck body.

In some embodiments, one or more of the vacuum channels are fabricated in the chucking surface of the chuck body along one or both sides of each of the one or more recessed annular channels that accommodate the extensible sealing elements. This maintains a tightly clamped connection as close as possible to the recessed annular channels. FIGS. 5-6 depict vacuum channels 113 and 114 disposed on both sides of recessed annular channel 112. Similarly, as depicted in FIG. 2, vacuum channels 120 and 121 are disposed on both sides of the recessed annular channel that accommodates extensible sealing element 103, vacuum channels 124 and 125 are disposed on both sides of the recessed annular channel that accommodates extensible sealing element 109, and vacuum channels 122 and 123 are disposed on both sides of the recessed annular channels that accommodate extensible sealing elements 111 that surround each of the collapsible bellows 102.

Figure 7:
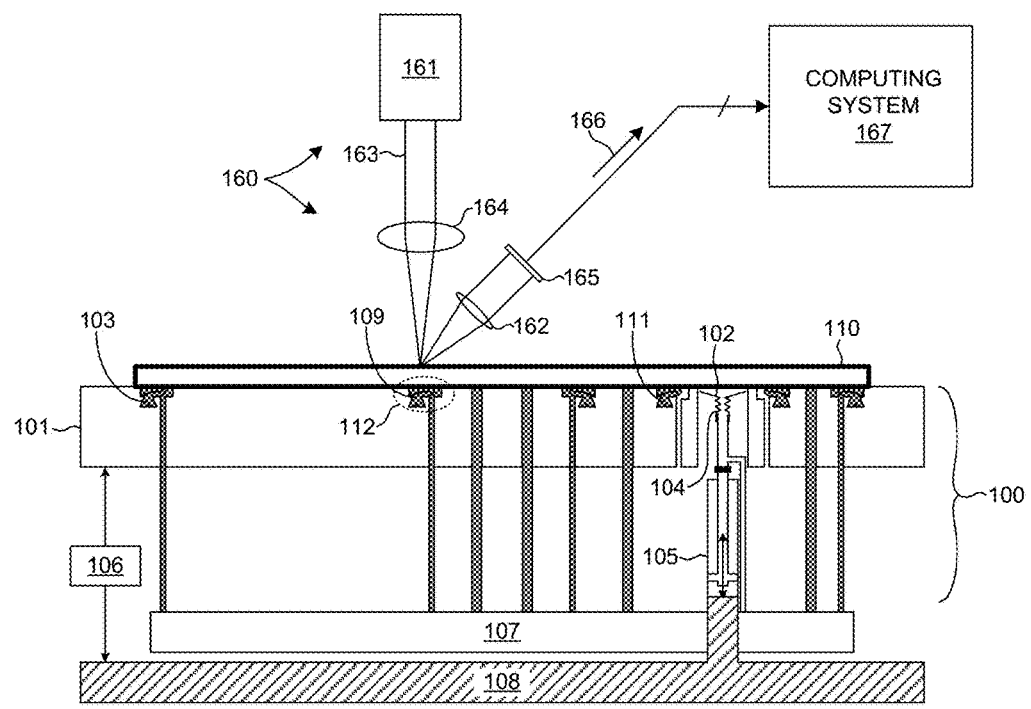
FIG. 7 illustrates a simplified schematic of an optical metrology or inspection system 160 positioned to inspect substrate 110 or perform measurements of structures formed on substrate 110 clamped by vacuum chuck 100.

FIG. 7 illustrates a simplified schematic of an optical metrology or inspection system 160 positioned to inspect substrate 110 or perform measurements of structures formed on substrate 110. In some embodiments, system 160 is configured as a scanning system. In some other embodiments system 160 is configured as a point to point measurement system. In the depicted embodiment, substrate 110 is vacuum clamped to chuck body 101, while chuck body 101 is moved in multiple degrees of freedom by motion stage subsystem 108.

As illustrated in FIG. 7, substrate 110 is illuminated by a normal incidence beam 163 generated by one or more illumination sources 161. Alternatively, the illumination subsystem may be configured to direct the beam of light to the specimen at an oblique angle of incidence. In some embodiments, system 160 may be configured to direct multiple beams of light to the specimen such as an oblique incidence beam of light and a normal incidence beam of light. The multiple beams of light may be directed to the specimen substantially simultaneously or sequentially.

Illumination source 161 may include, by way of example, a laser, a diode laser, a helium neon laser, an argon laser, a solid state laser, a diode pumped solid state (DPSS) laser, a xenon arc lamp, a gas discharging lamp, and LED array, or an incandescent lamp. The light source may be configured to emit near monochromatic light or broadband light. The illumination subsystem may also include one or more spectral filters that may limit the wavelength of the light directed to the specimen. The one or more spectral filters may be bandpass filters and/or edge filters and/or notch filters.

Normal incidence beam 163 is focused onto the substrate 110 by an objective lens 164. System 160 includes collection optics 162 to collect the light scattered and/or reflected by substrate 110 in response to the illumination light 163. Collection optics 162 focus the collected light onto a detector 165. The output signals 166 generated by detector 165 are supplied to a computing system 167 for processing the signals and determining the measurement parameter values (e.g., material or structural properties, dimensions, presence of particles, etc.). System 160 is presented herein by way of non-limiting example, as vacuum chuck 100 may be implemented within many different optical metrology and inspection systems.

As illustrated in FIG. 7, the system 160 is configured as an inspection system or a metrology system. In this manner, the system may be configured to inspect or measure wafers and reticles used as part of a semiconductor manufacturing process. The methods and systems described herein are not limited to the inspection or measurement of semiconductor wafers or reticles, and may be applied to the inspection of other substrates that need to be chucked to a flat surface for processing.

Figure 8:
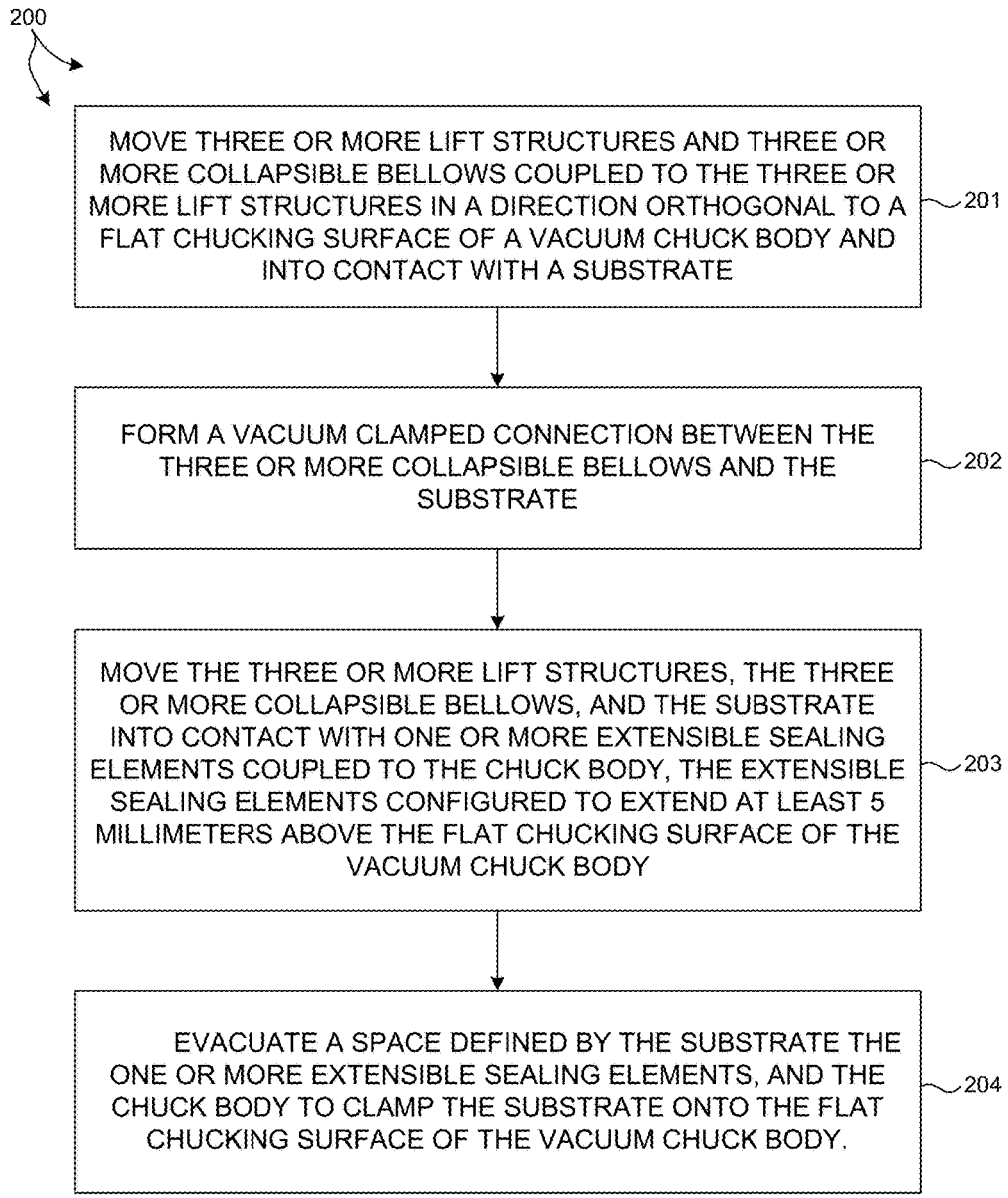
FIG. 8 is a flowchart illustrative of an exemplary method 200 useful for vacuum clamping and unclamping warped substrates onto a vacuum chuck in several novel aspects.

FIG. 8 illustrates a flowchart of an exemplary method 200 useful for vacuum clamping and unclamping warped substrates onto a vacuum chuck in several novel aspects. By way of non-limiting example, method 200 is described with reference to the vacuum chuck system 100 illustrated in FIGS. 1-4 for explanatory purposes. Although, the description of vacuum chuck system 100 includes references to specific hardware elements employed to achieve the elements of method 200, many other hardware elements known to persons of ordinary skill in the art may be contemplated to achieve an analogous result. Hence, any of the referenced hardware elements presented herein may be substituted, consolidated, modified, or eliminated without exceeding the scope of the description provided herein. Similarly, some of the elements of method 200 and the order of presentation of the elements of method 200 relate to the use of specific hardware elements described with reference to vacuum chuck system 100. However, as many other hardware elements known to persons of ordinary skill in the art may be contemplated to achieve an analogous result, some of the method elements and the order of presentation of the method elements may be substituted, consolidated, modified, or eliminated without exceeding the scope of the description provided herein.

In block 201, three or more lift structures and three or more collapsible bellows coupled to the three or more lift structures are moved in a direction orthogonal to a flat chucking surface of a vacuum chuck body and into contact with a substrate.

In block 202, a vacuum clamped connection is formed between the three or more collapsible bellows and the substrate.

In block 203, the three or more lift structures, the three or more collapsible bellows, and the substrate are moved into contact with one or more extensible sealing elements coupled to the chuck body. The extensible sealing elements are configured to extend at least 5 millimeters above the flat chucking surface of the vacuum chuck body.

In block 204, a space defined by the substrate, the one or more extensible sealing elements, and the chuck body is evacuated. This clamps the substrate onto the flat chucking surface of the vacuum chuck body.

The aforementioned embodiments of a vacuum chuck system are presented by way of non-limiting example. Other configurations may also be contemplated within the scope of this disclosure.

Embodiments of the present invention allow for effective chucking of concave, convex, or asymmetrically warped substrates, independent of shape. Furthermore, these embodiments handle wafers with a maximum out of plane distortion that is greater than 8 millimeters. The chuck apparatus described herein can be a drop-in replacement for standard chuck components.

Embodiments of the present invention can increase throughput of substrates by using the pin features only when necessary for warped wafers, thereby saving time during normal wafer operation. Embodiments also allow processing of warped wafers, which could not previously have been processed due the amount of warpage.

Although embodiments are described herein in terms of vacuum chucks, embodiments of the present invention may be adapted for use with other types of chucks, such as electrostatic, coulomb or Johnson-Rahbeck chucks.

Various embodiments are described herein for a semiconductor processing system (e.g., an inspection system, a metrology system, a lithographic system, an etch system, etc.). The term "substrate" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as quartz. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A vacuum chuck apparatus, comprising:
   a chuck body having a substantially flat chucking surface;
   three or more collapsible bellows each collapsible by at least five hundred micrometers in a direction orthogonal to the flat chucking surface of the chuck body, wherein each collapsible bellows has a compliant shape configured to conform to a non-planar backside surface of a substrate;
   three or more lift structures, each lift structure coupled to one of the three or more collapsible bellows; and
   one or more actuators configured to move the three or more lift structures and the three or more collapsible bellows in a direction orthogonal to the flat chucking surface of the chuck body and into contact with the substrate to form a vacuum clamped connection between the three or more collapsible bellows and the substrate, the one or more actuators further configured to move the three or more lift structures, the three or more collapsible bellows, and the substrate toward the flat chucking surface of the chuck body.

2. The vacuum chuck apparatus of claim 1, wherein the chuck body is mounted to a motion stage subsystem such that the chuck body is movable with respect to the motion stage subsystem in the direction orthogonal to the flat chucking surface of the chuck body, and wherein the three or more lift structures are movable with respect to the motion stage subsystem in the direction orthogonal to the flat chucking surface of the chuck body.

3. The vacuum chuck apparatus of claim 2, wherein the three or more lift structures are moveable with respect to the chuck body by a combination of movements of the chuck body and the three or more lift structures with respect to the motion stage subsystem such that the three or more collapsible bellows extend at least 10 millimeters above the flat chucking surface of the chuck body.

4. The vacuum chuck apparatus of claim 1, further comprising:
   one or more recessed annular channels in the chuck body, wherein each of the one or more recessed annular channels includes an extensible sealing element coupled to a bottom surface of the one or more recessed annular channels, wherein each extensible sealing element is configured to extend at least 5 millimeters above the flat chucking surface of the chuck body.

5. The vacuum chuck apparatus of claim 4, wherein the one or more recessed annular channels are coupled to one or more vacuum bleed orifices to regulate an amount of vacuum maintained in the one or more recessed annular channel when the substrate is vacuum clamped to the flat chucking surface of the chuck body.

6. The vacuum chuck apparatus of claim 1, further comprising:
   one or more vacuum channels distributed across the flat chucking surface of the chuck body, wherein each of the one or more vacuum channels are coupled to a vacuum source such that a vacuum is drawn through the one or more vacuum channels to vacuum clamp the substrate to the flat chucking surface of the chuck body.

7. The vacuum chuck apparatus of claim 6, wherein the one or more vacuum channels include one or more horizontal channels formed in the flat chucking surface of the chuck body between raised areas of the flat chucking surface of the chuck body.

8. The vacuum chuck apparatus of claim 1, further comprising:
   one or more vacuum channels disposed in the flat chucking surface of the chuck body surrounding each opening in the chuck body associated with each of the three or more collapsible bellows.

9. The vacuum chuck apparatus of claim 1, further comprising:
   one or more vacuum channels disposed in the flat chucking surface of the chuck body along one or both sides of each of the one or more recessed annular channels.

10. A vacuum chuck apparatus, comprising:
    a chuck body having a substantially flat chucking surface;
    one or more recessed annular channels disposed in the substantially flat chucking surface of the chuck body, wherein each of the one or more recessed annular channels includes an extensible sealing element coupled to a bottom surface of the one or more recessed annular channels, wherein each extensible sealing element is configured to extend at least 5 millimeters above the flat chucking surface of the chuck body;
    three or more lift structures each coupled to one of three or more collapsible bellows, wherein each collapsible bellows has a compliant shape configured to conform to a non-planar backside surface of a substrate; and
    one or more actuators configured to move the three or more lift structures and the three or more collapsible bellows in a direction orthogonal to the flat chucking surface of the chuck body and into contact with the substrate to form a vacuum clamped connection between the three or more collapsible bellows and the substrate, the one or more actuators further configured to move the three or more lift structures, the three or more collapsible bellows, and the substrate toward the extensible sealing elements coupled to the chuck body.

11. The vacuum chuck apparatus of claim 10, wherein the chuck body is mounted to a motion stage subsystem such that the chuck body is movable with respect to the motion stage subsystem in the direction orthogonal to the flat chucking surface of the chuck body, and wherein the three or more lift structures are movable with respect to the motion stage subsystem in the direction orthogonal to the flat chucking surface of the chuck body.

12. The vacuum chuck apparatus of claim 11, wherein the three or more lift structures are moveable with respect to the chuck body by a combination of movements of the chuck body and the three or more lift structures with respect to the motion stage subsystem such that the three or more collapsible bellows extend at least 10 millimeters above the flat chucking surface of the chuck body.

13. The vacuum chuck apparatus of claim 10, wherein the one or more recessed annular channels are coupled to one or more vacuum bleed orifices to regulate an amount of vacuum maintained in the one or more recessed annular channel when the substrate is vacuum clamped to the flat chucking surface of the chuck body.

14. The vacuum chuck apparatus of claim 10, further comprising:

one or more vacuum channels disposed in the flat chucking surface of the chuck body, wherein the one or more vacuum channels surround each opening in the chuck body associated with each of the collapsible bellows.

15. The vacuum chuck apparatus of claim 10, further comprising:
one or more vacuum channels disposed in the flat chucking surface of the chuck body along one or both sides of each of the one or more recessed annular channels.

* * * * *